(12) United States Patent
Ishihara et al.

(10) Patent No.: US 8,841,684 B2
(45) Date of Patent: Sep. 23, 2014

(54) LIGHT-EMITTING DEVICE

(75) Inventors: Kazuya Ishihara, Tsuru (JP); Jo Kinoshita, Fujiyoshida-ken (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/540,583

(22) Filed: Jul. 2, 2012

(65) Prior Publication Data

US 2013/0001605 A1 Jan. 3, 2013

(30) Foreign Application Priority Data

Jul. 1, 2011 (JP) ................................ P2011-147469

(51) Int. Cl.
| | | |
|---|---|---|
| *H01L 33/50* | (2010.01) | |
| *H01L 27/15* | (2006.01) | |
| *H01L 33/56* | (2010.01) | |
| *H01L 33/58* | (2010.01) | |
| *H01L 25/075* | (2006.01) | |

(52) U.S. Cl.
CPC ....... *H01L 33/56* (2013.01); *H01L 2224/48091* (2013.01); *H01L 33/58* (2013.01); *H01L 33/505* (2013.01); *H01L 25/0753* (2013.01); *H01L 2933/0091* (2013.01)
USPC .. 257/88; 257/98; 257/E33.061; 257/E27.12; 438/22; 438/25

(58) Field of Classification Search
CPC ... H01L 33/505; H01L 33/56; H01L 25/0753; H01L 33/58; H01L 2224/48091; H01L 2933/091; H01L 33/64; H01L 33/486; H01L 33/50
USPC ........... 257/88, 98, E33.061, E27.12; 438/22, 438/25–29, 47
See application file for complete search history.

(56) References Cited

U.S. PATENT DOCUMENTS

| | | | | |
|---|---|---|---|---|
| 6,774,404 | B2* | 8/2004 | Imai ............................... | 257/98 |
| 6,833,565 | B2* | 12/2004 | Su et al. ......................... | 257/98 |
| 7,334,907 | B2 | 2/2008 | Nagayama | |
| 7,649,209 | B2* | 1/2010 | Hussell et al. ................. | 257/98 |
| 2007/0262339 | A1* | 11/2007 | Hussell et al. ................. | 257/99 |
| 2008/0186714 | A1 | 8/2008 | Nagayama | |

FOREIGN PATENT DOCUMENTS

| | | |
|---|---|---|
| JP | 2005277227 A | 10/2005 |
| JP | 2007019096 A | 1/2007 |
| JP | 2010192629 A | 9/2010 |

* cited by examiner

*Primary Examiner* — Thinh T Nguyen
(74) *Attorney, Agent, or Firm* — Browdy and Neimark, PLLC

(57) ABSTRACT

A light-emitting device includes a circuit substrate including at least a pair of electrodes, an LED element electrically mounted on the circuit substrate, a phosphor plate disposed on an upper surface of the LED element, a diffuser plate disposed on an upper surface of the phosphor plate, and a white resin disposed on an upper surface of the circuit substrate and covering a peripheral side surface of the LED element, a peripheral side surface of the phosphor plate, and a peripheral side surface of the diffuser plate. The present invention makes it possible to obtain a planar light-emitting surface even with a plurality of LEDs, and also, a problem of color-ring occurrence caused by a phosphor may be less represented.

18 Claims, 14 Drawing Sheets

LIGHT-EMITTING DEVICE

CROSS REFERENCE TO RELATED APPLICATION

This application is based on and claims the priority benefit of Japanese Patent Application No. 2011-147469, filed on Jul. 1, 2011, the disclosure of which is incorporated herein by reference in its entirety.

BACKGROUND OF THE INVENTION

1. Field of the Invention

The present invention relates to a light-emitting device including light-emitting elements such as LED elements or the like, more specifically to a light-emitting device with a planar light-emitting area.

2. Description of the Related Art

Conventionally, there is proposed a light-emitting device configured to acquire various light-emitting colors by a color mixing of light obtained from a combination of a light source and a phosphor plate excited by light emitted from the light source and capable of emitting light of color phase different from light-emitting color of the light source. In particular, a light-emitting device using a light-emitting diode element (hereinafter, referred to as LED element) as a light source has already been put into practical use as the next-generation illumination replaced by a fluorescent lamp, because the LED element has a low power consumption and a long service life, as a backlight for a crystal display, or a high brightness lamp reaching instantly to a high brightness, and further improvement in output, uniform light-emitting color and brightness in light-distribution are demanded.

FIG. 13 illustrates an example of a conventional light-emitting device.

The conventional light-emitting device 900 as schematically shown includes a circuit substrate 80, an LED element 10 mounted in a manner of flip-chip on an upper surface of the circuit substrate 80, a first light-reflection resin 40 covering the entirety of a side surface of the LED element 10, a phosphor plate 20 covering an upper surface of the LED element 10 and a part of an upper surface of the first light-reflection resin 40, and a second light-reflection resin 50 covering a side surface of the first light-reflection resin 40 and a side surface of the phosphor plate 20 (for reference, see JP2010-192629A). In the conventional light-emitting device, light leaked from the side surface of each of the LED element 10 and the phosphor plate 20 is reflected on the first light-reflection resin 40 and the second light-reflection resin 50 and returned into the LED element 10 and the phosphor plate 20.

On the other hand, there is known another conventional light-emitting device in which only the side surface of the LED element 10 is covered with the first light-reflection resin 40 and the side surface of the phosphor plate 20 is not covered (for reference, see JP2007-19096A).

In the conventional light-emitting device 900, by covering the side surface of the LED element with the first light-reflection resin 40 and the side surface of the phosphor plate 20 with the second light-reflection resin 50, light leaked from the side surfaces is reduced, as a result, it is possible to provide the light-emitting device 900 having a bright light-illumination surface.

However, as shown schematically in FIG. 14, for example, exit light Ph emitted right above from the LED element 10 emitting blue light is emitted as white light by color mixture of blue radiation light occurred by the fact that a distance passing the phosphor plate 20 is short and yellow radiation light occurred from a wave-conversion converted by, for example, YAG-system fluorescent particles dispersed in the phosphor plate 20. In contrast, exit light Py emitted obliquely above from the upper surface of the LED element 10 increases the number of impacting with the YAG-system fluorescent particles, thereby an amount converted into yellow increases and the exit light Py is yellowing, because the emitted light passes through the phosphor plate 20 throughout a longer distance than the distance of the exit light Ph passing through the phosphor plate 20 vertically. Therefore, as shown in FIG. 15, in a central portion on the irradiation surface of the light-emitting device 900, an adequate color mixture is achieved, thereby white color light 910 can be acquired. However, in a peripheral portion on the irradiation surface, the exit light appears to be a colored ring, and when YAG is used as a phosphor, yellow-ringed light caused by the YAG-system fluorescent particles, and therefore, a problem of a yellow ring 920 occurs.

In this way, in the conventional light-emitting device 900, by covering the side surface of the LED element 10 with the first light-reflection resin 40 and the side surface of the phosphor plate 20 with the second light-reflection resin 50, although the light leaked from these side surfaces can be reduced, a problem of the colored ring occurred by the light emitted obliquely above from the phosphor plate 20 is not resolved. In addition, there are minus factors such as the colored ring or leakage of light from the side surfaces of the LED element and so on, it is difficult to control or adjust the minus factors by optical systems such as lenses and so on.

In particular, as popularization of a light-emitting device using an LED element to an application field proceeds, a light-emitting device in which light leaked from a side surface of an LED element is reduced, uniform light-emitting color is acquired to inhibit the occurrence of a colored ring, and light can be efficiently controlled has been demanded. For example, in case of illumination when photographing, light distribution for the illumination and brightness according to a view angle of a photographing lens are required, and in case of a color photograph, uniform light-emitting color having no colored ring or variation in color is requested.

SUMMARY OF THE INVENTION

The present invention is proposed in view of such conventional devices as above-described.

According to embodiments of the present invention, a light-emitting device includes a circuit substrate including at least a pair of electrodes, an LED element electrically mounted on the circuit substrate, a phosphor plate disposed on an upper surface of the LED element, a diffuser plate disposed on an upper surface of the phosphor plate, and a white resin disposed on an upper surface of the circuit substrate and covering a peripheral side surface of the LED element, a peripheral side surface of the phosphor plate, and a peripheral side surface of the diffuser plate.

In the light-emitting device, the upper surface of the LED element, the upper surface of the phosphor plate and the upper surface of the diffuser plate are same in size in plan view.

The upper surface of the diffuser plate may be larger than the upper surface of the phosphor plate in plan view.

Also, the phosphor plate may include a pair of cut portions, the diffuser plate may include a pair of cut portions that overlap the pair of cut portions of the phosphor plate in plan view, and a pair of electrodes of the LED element are positioned on the upper surface of the LED element at the pair of cut portions of the diffuser plate and the pair of cut portions of the phosphor plate in plan view.

The pair of electrodes of the LED element may be electrically connected by a pair of wires to the at least the pair of electrodes included in the circuit substrate. Also, the pair of electrodes of the LED element may be positioned on a lower surface of the LED element and electrically connected by bumps to the at least the pair of electrodes included in the circuit substrate.

As in other embodiments, a plurality of LED elements may be electrically mounted on the circuit substrate.

DETAILED DESCRIPTION OF THE PREFERRED EMBODIMENTS

Figure 1A:
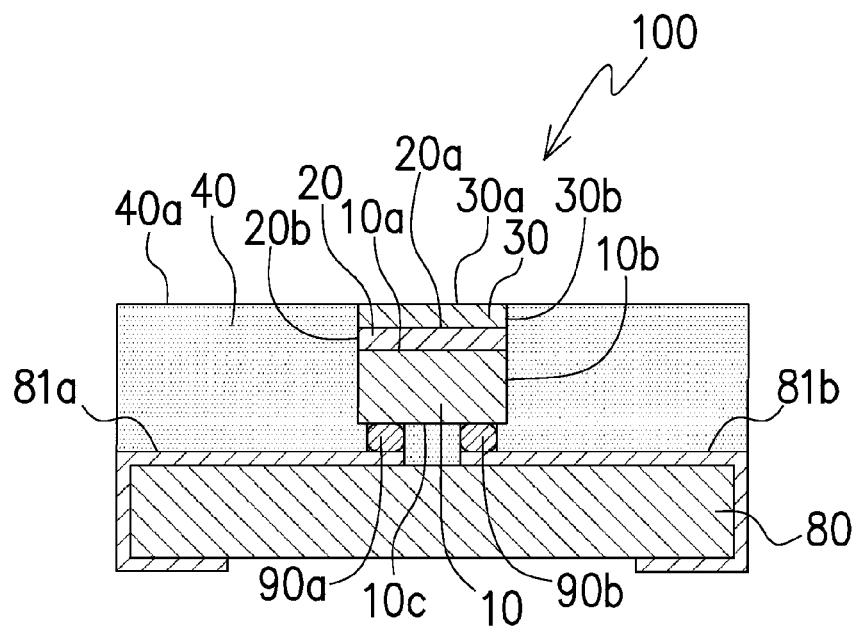
FIG. 1A is a sectional view of a light-emitting device according to a first embodiment of the present invention.

A light-emitting device 100 in embodiments according to the present invention includes a circuit substrate 80 including at least a pair of electrodes 81a, 81b, an LED element 10 electrically mounted on the circuit substrate 80, a phosphor plate 20 disposed on an upper surface 10a of the LED element, a diffuser plate 30 disposed on an upper surface 20a of the phosphor plate 20, and a white resin 40 disposed on an upper surface of the circuit substrate 80 and covering a peripheral side surface 10b of the LED element 10, a peripheral side surface 20b of the phosphor plate 20, and a peripheral side surface 30b of the diffuser plate 30.

Further embodiments will be explained hereinafter in detail with reference to the accompanying drawings. drawings, and in the following embodiments, identical reference numbers are used to indicate same and/or similar parts

First Embodiment

Figure 1B:
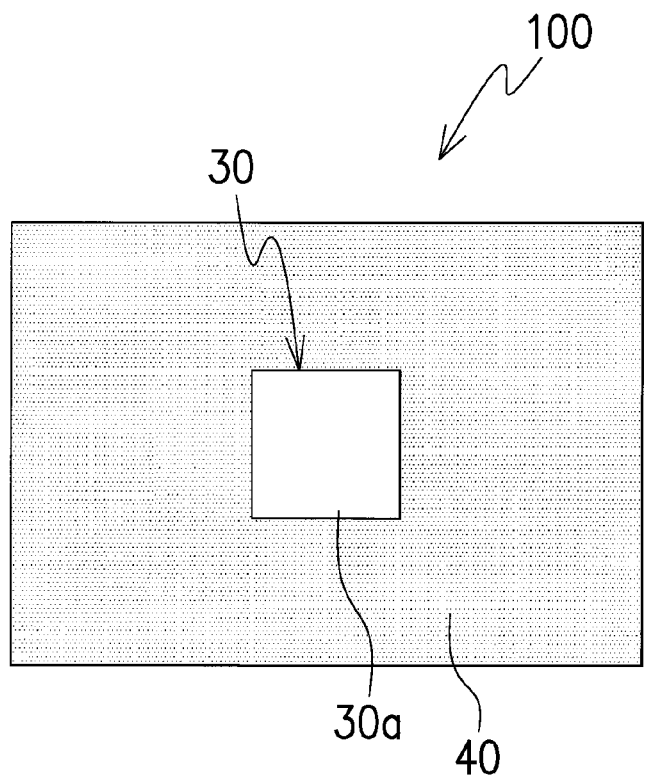
FIG. 1B is a plan view of the light-emitting device shown in FIG. 1.

FIGS. 1A and 1B illustrates a light-emitting device according to a first embodiment of the present invention. The light-emitting device 100 includes a circuit substrate 80 made of resin or include a material of thermal conductivity, a pair of upper electrodes 81a and 81b provided on an upper surface of the circuit substrate 80, and an LED element 10 mounted on the upper electrodes 81a and 81b through bumps 90a, 90b as electrically conductive members. A pair of electrodes of the LED element 10 are positioned at a lower surface 10c of the LED element 10 and electrically connected to the pair of upper electrodes 81a and 81b of the circuit substrate 80 through the bumps 90a and 90b. A phosphor plate 20 has a planar plate shape and a diffuser plate 30 has a planar plate shape. The upper surface 10a of the LED element 10, the upper surface 20a of the phosphor plate 20, and the upper surface 30a of the diffuser plate 30 are same in size in plan view. The phosphor plate 20 is adhered to the upper surface 10a of the LED element 10 by a transparent adhesive, and the diffuser plate 30 is adhered to the upper surface 20a of the phosphor plate 20 by a transparent adhesive.

The LED (light-emitting diode) element 10 may be flipped over and mounted on the pair of upper electrodes 81a and 81b through bumps 90a and 90b, that is a mounting technology interconnecting semiconductors, such as IC chips, LED elements, and microelectromechanical systems (MEMS) and so on to circuitry with conductive members such as bumps. The circuit substrate 80 may include another pair of electrodes or more, and the LED element 1 may be electrically mounted on the pair of electrodes and on another pair of electrodes or more (Flip-Chip mounting or FC mounting).

As the LED element 10, a GaN-system semiconductor element or any other semiconductor elements or any other semiconductor elements can be used. The phosphor plate 20 has a planar shape containing, for example, a wave-conversion phosphor to convert wavelength of at least a part of light toward the phosphor plate 20, into a base material such as a resin or glass. For example, a phosphor and/or a combination of one or more kinds or phosphors may be used for the wave-conversion material. The diffuser plate 30 has a filmlike or plate-like shape formed by a resin, glass or inorganic material that transmits and diffuses light.

A reflective white resin 40 is disposed on the upper surface of the circuit substrate 80, disposed to a position of a peripheral edge of the diffuser plate 30 sealing a peripheral side surface of the LED element 10, a peripheral side surface of the phosphor plate 20, and a peripheral side surface of the diffuser plate 30. The upper surface of the reflective white resin 40 and the upper surface of the diffuser plate 30 are flush with each other. The white resin 40 covers a peripheral side surface 19b of the LED element 10, a peripheral side surface 20b of the phosphor plate 20, and a peripheral side surface 30b of the diffuser plate 30 as a whole. If there is a clearance between the lower surface 10c of the LED element 10 and the upper surface of the circuit substrate 80, such a clearance and gaps around the peripheral side surfaces of the LED element 10, the phosphor plate 20 and the diffuser plate 30 can be also filled with the white resin 40. The white resin 40 may contain, for example, silicone as a resin material and titanium oxide as a light-reflective material.

Figure 2:
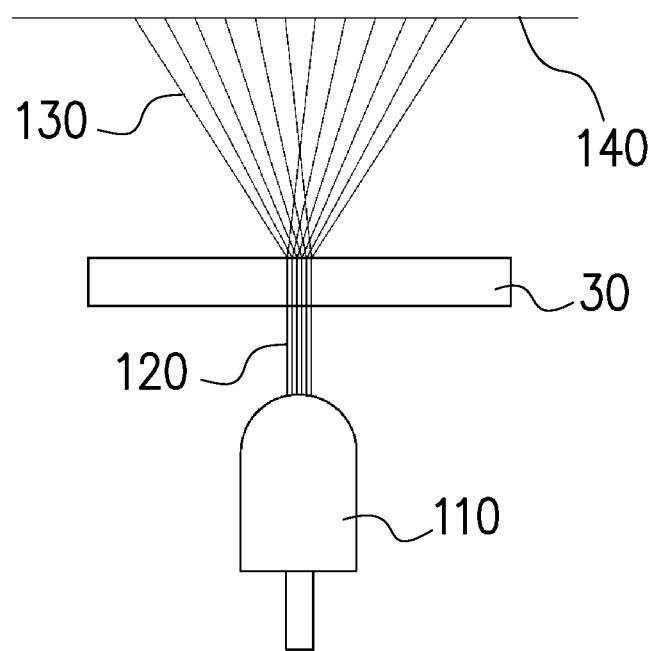
FIG. 2 is a schematic view showing a diffusion operation of light in a diffuser plate of the present invention.

FIG. 2 illustrates a principle of the diffuser plate 30 from which light is radiated. Here, light emitted from a light emitter 110 is explained as parallel light 120. When the parallel light 120 passes through the diffuser plate 30, the parallel light flux from the light emitter 110 is uniformly diffused around an advancing direction of the parallel light flux by the diffuser plate 30 to be diffusion light 130. When the parallel light 120 is uniformly diffused, desired color mixture of the light may be achieved. As a result, light appeared like a colored ring can be less noticeable The diffuser plate 30 includes a concave-convex surface, in other words, a micro-lens array. The diffuser plate 30 can refract light by a refraction operation of the micro-lens array, and select a diffusion angle thereof, for example, throughout a range of 5 to 80 degrees, by a power of the micro-lens array. As a power of the lens is large, a diffusion angle of the diffuser plate is large. The smaller power, the smaller diffusion angle. That is to say, it is possible to determine an irradiation range required in certain distance, illumination intensity and evenness required at an illumination surface 140, and select a diffusion angle of the diffuser plate 30.

In this embodiment, by selecting a relatively small diffusion angle, for example, 5 to 10 degrees, it is possible to irradiate light in a certain scope without overextending a diffusion angle and acquire uniform illumination light of less energy loss. Usually, if there are minus factors such as a misalignment between the LED element 10 and the phosphor plate 20 or protrusion of the adhesive, the influence is reflected on the illumination light, and there is possibility that the minus factors can be imaged on the illumination surface. This influence can be resolved by overlapping the diffuser plate 30 on a light-emitting surface of the phosphor plate 20.

In the first embodiment, because the peripheral side surface 10b of the LED element 10 and the peripheral side surface 20b of the phosphor plate 20 are covered with the white resin 40, light leaked from the peripheral side surface 10b of the LED element 10 and the peripheral side surface 20b of the phosphor plate 20 is reflected on the white resin 40 and returns into the LED element 10 and the phosphor plate 20 again, thereby the light leaked from the peripheral side surface 10b of the LED element 10 and the peripheral side surface 20b of the phosphor plate 20 can be significantly reduced. In addition, light emitted obliquely and upward from the LED element 10 requires a long distance in passing the phosphor plate 20, therefore light emitted from the upper surface 20a of the phosphor plate 20 appears to be a colored ring.

However, it is possible to acquire uniform light diffused from upper surface 30a of the diffuser plate 30 at a homogeneous angle by the diffusion operation and the color mixing operation of the diffuser plate 30 in addition to covering the peripheral side surface 30b of the diffuser plate 30 with the white resin 40. In other words, it is possible to obtain a surface light source of a micro area close to a point light source, and therefore, a problem of colored ring occurrence can be less represented.

Second Embodiment

Figure 3A:
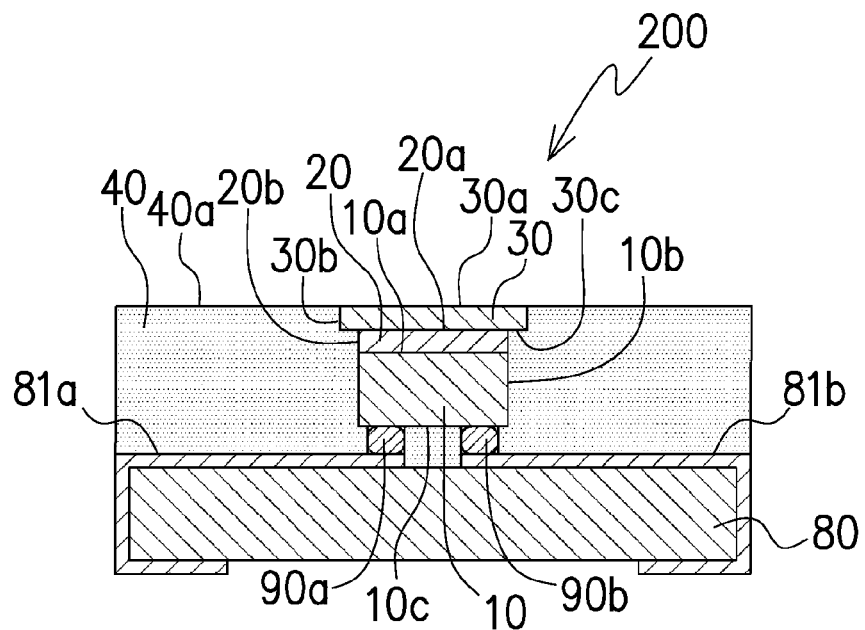
FIG. 3A is a sectional view of a light-emitting device according to a second embodiment of the present invention.
Figure 3B:
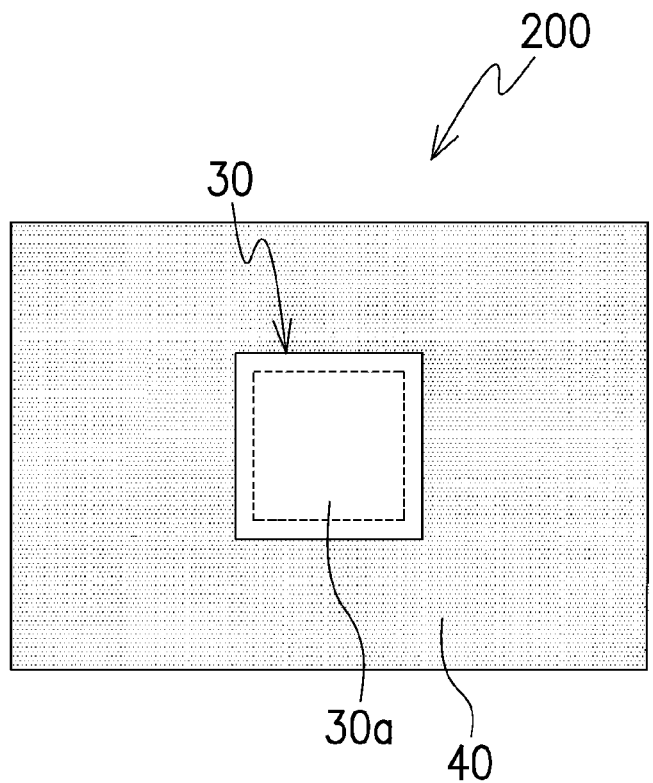
FIG. 3B is a plan view of the light-emitting device shown in FIG. 3A.

FIGS. 3A and 3B illustrate a light-emitting device according to a second embodiment of the present invention.

The second embodiment may differ from the first embodiment in that an upper surface 30a of the diffuser plate 30 is larger than the upper surface 20a of the phosphor plate 20 in plane view. Consequently, when the diffuser plate 30 is disposed on the upper surface 20a of the phosphor plate 20, a peripheral side portion including a peripheral side surface 30b of the diffuser plate 30 protrudes from the peripheral side surface 20b of the phosphor plate 20. The peripheral side surface 10b of the LED element 10, the peripheral side surface 20b of the phosphor plate 20 and the peripheral side surface 30b of the diffuser plate 30 are covered with the white resin 40 that is disposed on the upper surface of the circuit substrate 80. The second embodiment is explained with identical reference numbers to parts similar to those of the light-emitting device 100 in the first embodiment, descriptions overlapping among embodiments are omitted.

In this way, as the diffuser plate 30 is set larger than the upper surface 20a of the phosphor plate 20 in size in plan view, even if an excess adhesion is applied between the phosphor plate 20 and the diffuser plate 30, the diffuser plate 30 still can cover such an excess adhesion and prevent light leak caused by the excess adhesion used to adhere the phosphor plate 20 to the LED element 10 and the diffuser plate 30 to the phosphor plate 20.

With a light-emitting device according to this embodiment of the present invention, a planar light source with a small light-emitting area close to a point light can be achieved and also a problem of a colored ring occurrence can be less represented by reflection effect by white resin, diffusion effect by diffuser plate, and light-mixing effect. Meanwhile, when an outer shape of the diffuser plate 30 is larger than that of the phosphor plate 20, an amount of diffusion light emitted obliquely from the upper surface 30a of the diffuser plate 30 may increase, however, this can be prevented by designing the diffuser plate 30 within a size that does not affect the emitted light as a whole even with an increment of the obliquely emitted.

Third Embodiment

Figure 4A:
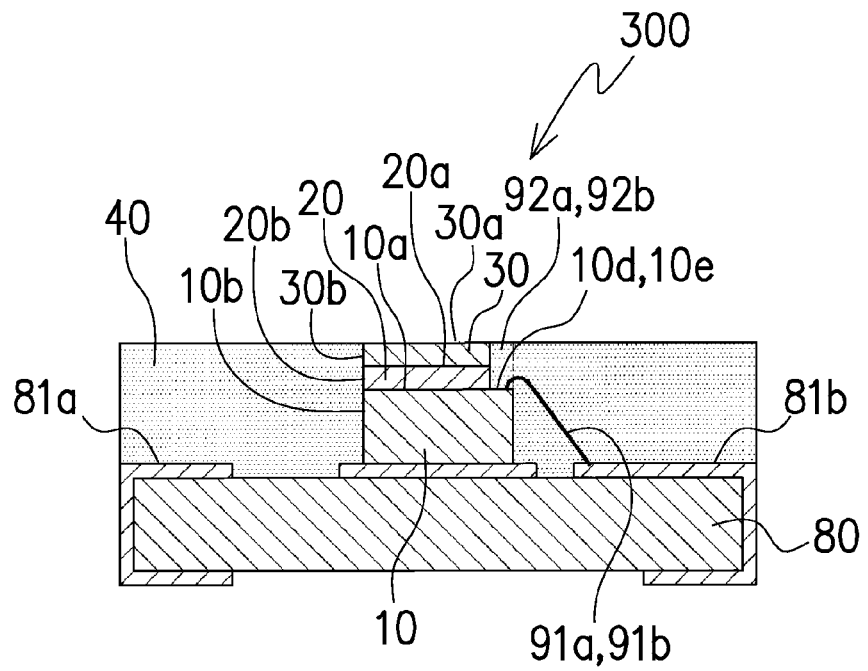
FIG. 4A is a sectional view of a light-emitting device according to a third embodiment of the present invention.
Figure 4B:
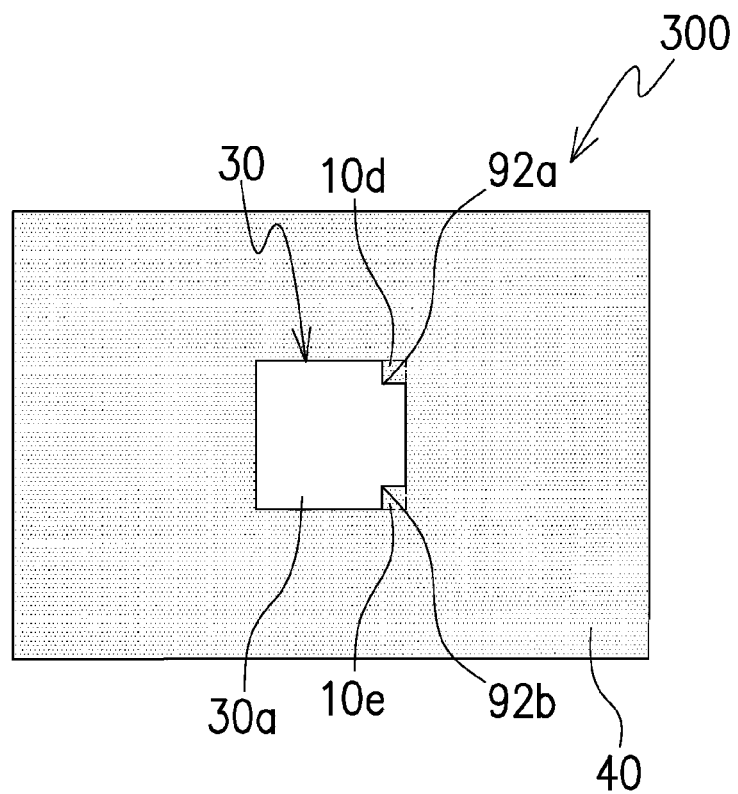
FIG. 4B is a plan view of the light-emitting device shown in FIG. 4A.
Figure 5:
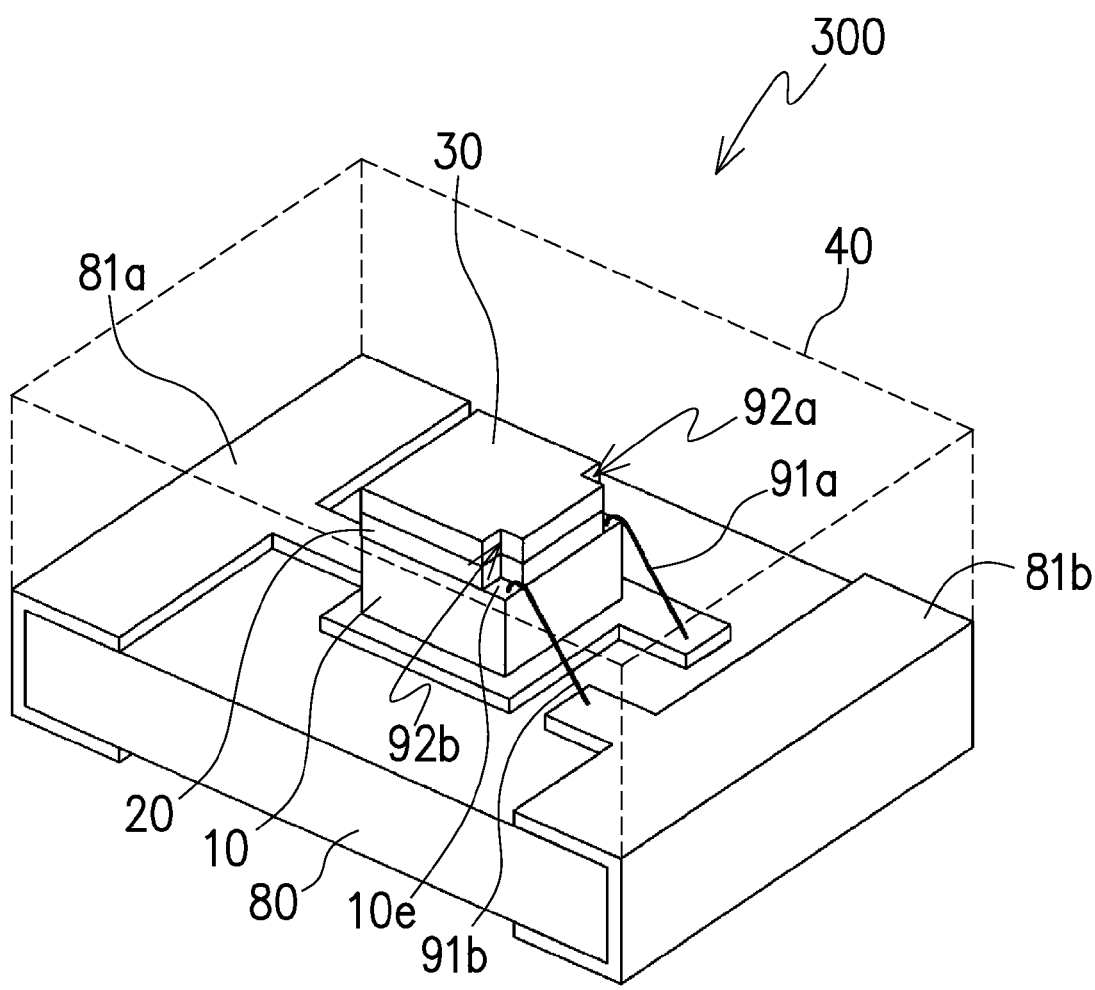
FIG. 5 is a perspective view of the light-emitting device shown in FIG. 4A.

FIGS. 4A, 4B and 5 illustrate a light-emitting device according to a third embodiment of the present invention.

In the light-emitting device according to this embodiment, similar to the light-emitting device 100 according to the first embodiment as mentioned above, the LED element 10 is mounted on the upper surface of the circuit substrate 80, and a phosphor plate 20 is disposed on the upper surface 10a of the LED element 10, and a diffuser plate 30 is disposed on an upper surface 20a of the phosphor plate 20.

The light-emitting device 300 in the third embodiment differs from the light-emitting device 100 in the first embodiment in that a pair of electrodes 10d and 10e of the LED element are positioned at the upper surface 10a of the LED element 10 and are electrically connected through a pair of wires 91a and 91b to the upper electrodes 81a and 81b of the circuit substrate 80, respectively. The phosphor plate 20 includes a pair of cut portions 92a and 92b, and the diffuser plate 30 includes a pair of cut portions 92a and 92b that overlap the pair of cut portions 92a and 92b of the phosphor plate 20 in plan view. The pair of electrodes 10d and 10e of the LED element 10 are positioned on the upper surface of the LED element 10 at the pair of cut portions 92a and 92b of the diffuser plate 30 and the pair of cut portions 92a and 92b of the phosphor plate 20 in plan view. The electrodes 10d and 10e of the LED element 10 are uncovered at the cut portions 92a and 92b.

The peripheral side surface 10b of the LED element 10, the peripheral side surface 20b of the phosphor plate 20 and the peripheral side surface 30b of the diffuser plate 30 are covered with the white resin 40 formed on the upper surface of the circuit substrate 80. The upper surface 20a of the phosphor plate 20 and the upper surface 30a of the diffuser plate 30 are a same size in plan view.

The cut portions 92a and 92b are formed by cutting a pair of corners of each of the phosphor plate 20 and the diffuser plate 30, facing the electrodes 10d and 10e of the LED element 10 in a small square-like shape. These cut portions are overlapped in an aligned state in plan view.

In this way, because the small cut portions 92a and 92b are provided and the diffuser plate 30 has an operation of diffusing the irradiated light, the cut portions are not imaged on the illumination surface of the light-emitting device 300, and therefore have no practical problem. Consequently, even if the light-emitting device 300 including the LED element 10 with the electrodes 10d and 10e provided on the upper surface 10a of the LED element 10 is used, a planar light source with a small light-emitting area close to a point light can be achieved. Also a problem of colored ring occurrence can be less represented by reflection effect by white resin, diffusion effect by diffuser plate, and light-mixing effect.

Fourth Embodiment

In the following embodiments, a plurality of LED elements 10 may be provided. For example, a first LED element 10, and a first phosphor plate 20 similar to those disclosed in embodiments mentioned above are provided. The first phosphor plate 20 may be disposed on the upper surface of the first LED element that is electrically mounted on a circuit substrate 80, and a first diffuser plate 30 similar to that disclosed in embodiments is provided on the upper surface of the first phosphor plate 20. Furthermore, a second light-emitting diode element electrically mounted on the circuit substrate 80, a second phosphor plate 20 disposed on an upper surface of the second light-emitting diode element 10, and a second diffuser plate 30 disposed on the upper surface of the second phosphor plate 20. The white resin 40 is disposed on the upper surface of the circuit substrate and covering peripheral side surfaces of the first LED element 10 and the second LED element 10, peripheral side surfaces of the first phosphor plate 20 and the second phosphor plate 20, and peripheral side surfaces of the first diffuser plate 30 and the second diffuser plate 30. Also, a third, a fourth and more LED elements 10 may be electrically mounted on the circuit substrate 80. A third, a fourth and more phosphor plates 20 may be disposed on respective upper surfaces of the third, the fourth and more LED elements 10. Furthermore, a third, a fourth and more diffuser plates 30 may be disposed on respective upper surfaces of the third, the fourth and more phosphor plates 20, and the white resin 40 disposed on the upper surface of the circuit substrate 80 and covering peripheral side surfaces of the first, the second, the third, the fourth and more LED elements 10, peripheral side surfaces of the first, the second, the third, the fourth and more phosphor plates 20, and peripheral side surfaces of the first, the second, the third, the fourth, and more diffuser plates 30. If there are clearances between lower surfaces of the LED elements 10 and the upper surface of the circuit substrate 80, such clearances may be sealed by the white resin 40.

Figure 6A:
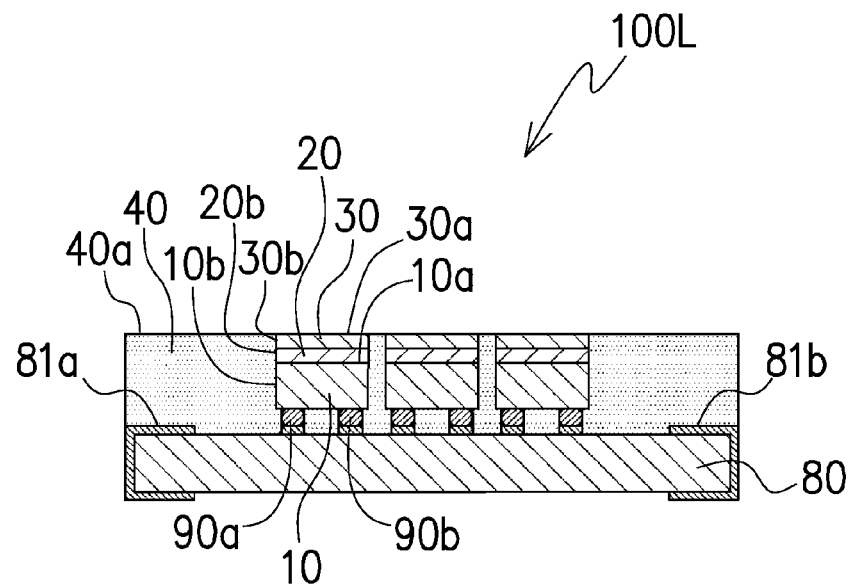
FIG. 6A is a sectional view of a light-emitting device according to a fourth embodiment of the present invention, in which a plurality of LED elements is electrically mounted on a circuit substrate.
Figure 6B:
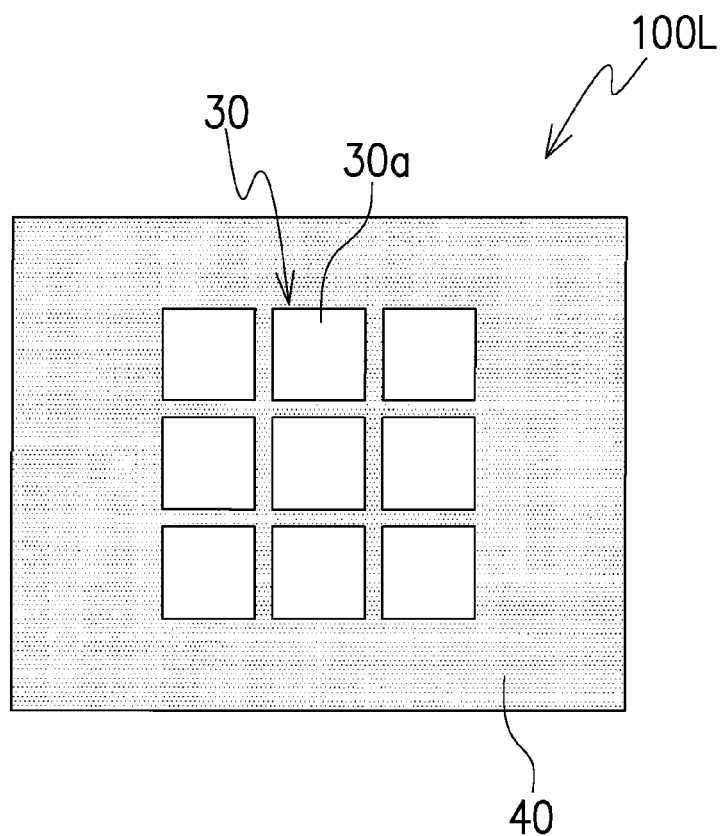
FIG. 6B is a plan view of the light-emitting device shown in FIG. 6A.

FIGS. 6A and 6B illustrate a light-emitting device according to a fourth embodiment of the present invention.

The light-emitting device 100L in this embodiment includes a plurality of LED elements 10 mounted on an upper surface of a circuit board 80. In this embodiment, nine LED elements in total are electrically mounted on the upper surface of the circuit substrate 8 and arranged in a matrix in a plane with an appropriate space between adjacent LED elements 10 to prevent a short circuit.

Similar to the light-emitting device in the first embodiment, the phosphor plate 20 and the diffuser plate 30 are layered on the upper surface 10a of each LED element 10. The white resin 40 is provided on the circuit substrate 80, provided to a position of peripheral upper edges of the upper surfaces 30a of the diffusion plates 30. The white resin 40 seals the peripheral side surface 10b of the LED element 10, the peripheral side surface 20b of the phosphor plate 20 and the peripheral side surface 30b of the diffuser plate 30 with the upper surfaces 30a of the diffusion plates 30 uncovered by the white resin 40 and flush with the upper surface 40a of the white resin 40.

As mentioned above, it is possible to acquire a planar light-emitting area achieved by the plurality of LED elements 10 that appears to be a uniform light-emitting area with a reflection effect of the white resin 40 disposed around LED elements 10 and/or a diffusion effect by the diffusion plates 30, and as a result, a problem of a colored ring occurrence can be less represented. In addition, with the plurality of LED elements 10 arranged in a light-emitting device, a brighter and larger light-emitting area can be acquired. Meanwhile, in the light-emitting device according to the fourth embodiment, identical reference numbers are attached to parts similar to that of the light-emitting device according to the first light-emitting device 100, a duplicative description thereof is omitted.

Figure 7A:
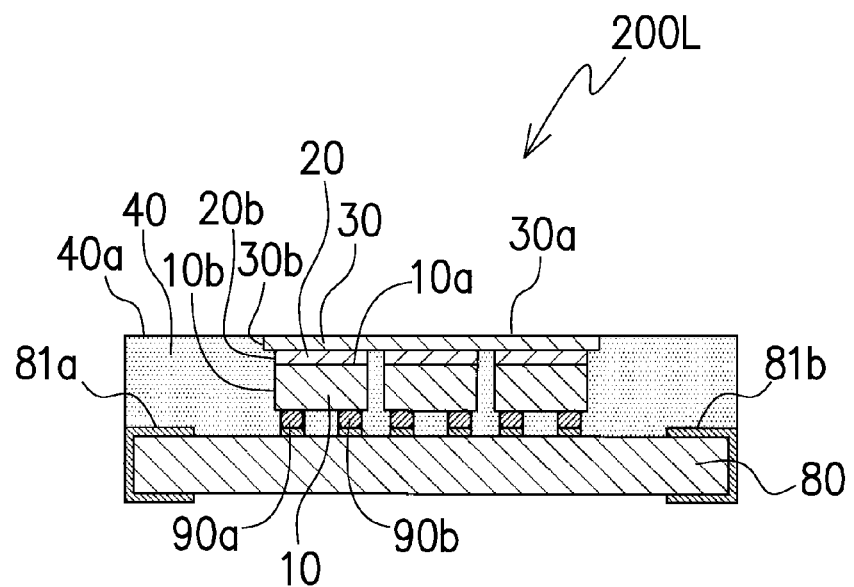
FIG. 7A is a sectional view showing a light-emitting device according to a fifth embodiment of the present invention, including a plurality of LED elements.
Figure 7B:
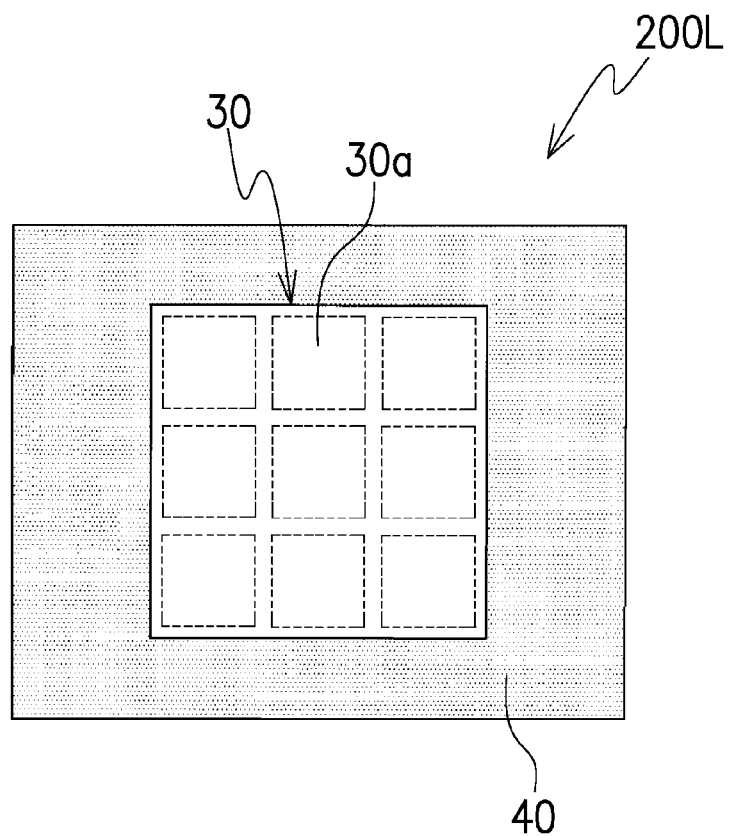
FIG. 7B is a plan view of the light-emitting device shown in FIG. 7A.

FIGS. 7A and 7B illustrate a modified example of the light-emitting device according to the fourth embodiment. In this embodiment, a single diffuser plate 30 disposed on and extended to cover upper surfaces 20a of a plurality of the phosphor plates 20 may be provided.

A light-emitting device 200L according to the modified example includes nine LED elements of horizontal and vertical three-rows mounted on an upper surface of a circuit substrate 80, a plurality of phosphor plates 20 each being disposed on an upper surface of each of the LED elements, and a diffuser plates 30 disposed on upper surfaces of the phosphor plates 20. The single diffuser plate 30 may have a size covering all the nine LED elements. In the modified example, because a clearance between adjacent LED elements 10 is covered with the diffuser plate 30, the diffusion light can be further homogenized.

Meanwhile, the arrangement of the LED element 10 in each of the light-emitting devices 100L and 200L is not limited to the embodiments as mentioned above, for example, a plurality of LED elements 10 may be arranged in a circular shape, or to extend in a straight line in a horizontal direction. Moreover, the number of the LED elements 10 is not also limited to the aforementioned embodiments. For example, at least two LED elements; a first LED element and a second LED element or more LED elements may be provided.

In addition, the first to fourth or more any numbers of phosphor plates 20 are selected corresponding to the number of the LED elements 10. However, with respect to the number of the diffuser plate 30, there are two cases in which first to fourth or more any numbers of diffuser plates 30 are selected corresponding to the number of the LED elements 10 or the phosphor plates 20, and a large one diffuser plate is disposed on the entirety of the plurality of LED elements and the plurality of phosphor plates, regardless of the number of the LED elements and the phosphor plates. In this way, the arrangement and the number of the LED elements, the phosphor plates or the diffuser plates can be set optionally. Consequently, it is possible to structure the light-emitting device to be capable of accomplishing the reflection operation of the white resin 40, and the diffusion operation and the color mixing operation of the diffuser plate 30 according to the aim.

Fifth Embodiment

In this embodiment, a light-emitting device 100 may include a cover 60. The cover 60 may include a peripheral portion 60*a* and an upper surface portion 60*b* that is positioned at one end of the peripheral portion 60*a* of the cover 60, and wherein the peripheral portion 60*a* of the cover is disposed on the upper surface of the substrate 80 outside the white resin, and the upper surface portion 60*b* including a lens 61 that faces the diffuser plate 30. The upper surface portion 60*b* cover above the upper surface of the diffusion plate 30 and the upper surface 40*a* of the white resin 40. If a plurality of diffuser plates 30 are provided for a plurality of LED elements 10, the lens 61 may be provided to face the first, the second, the third, the fourth and more diffuser plates 30, for example. Also, the lens 61 may include a Fresnel lens.

Figure 8A:
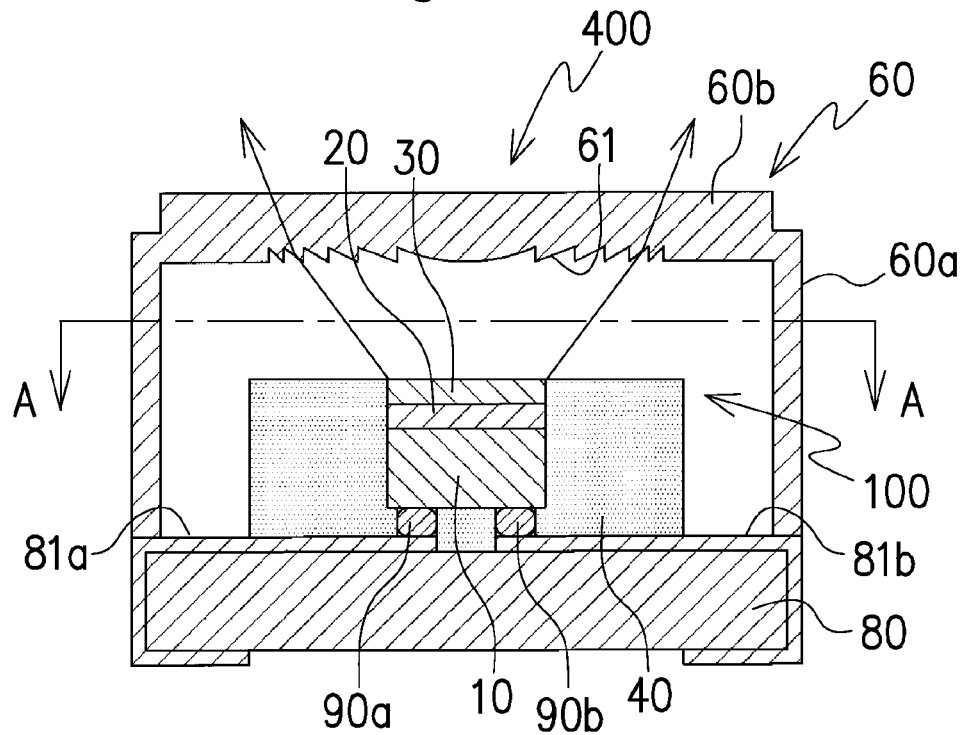
FIG. 8A is a sectional view showing a light-emitting device according to a sixth embodiment of the present invention, including a Fresnel lens.
Figure 8B:
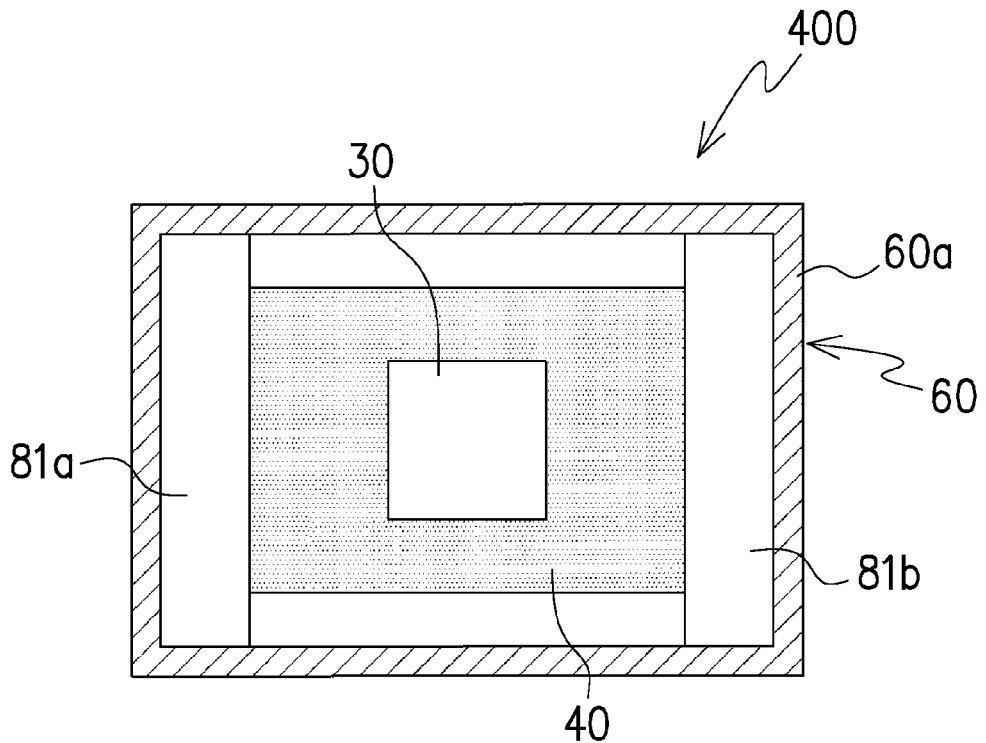
FIG. 8B is a sectional view taken along line A-A of the light-emitting device shown in FIG. 8A.

FIGS. 8A and 8B illustrate a light-emitting device according to a fifth embodiment.

The light-emitting device 400 according to this embodiment includes a cover 60 covering an upper portion of the light-emitting device 100 in the first embodiment. The cover 60 forms a box-like hollow body including a peripheral portion 60*a* disposed at an outer peripheral edge of the upper surface of the circuit substrate and an upper surface portion 60*b* that closes an upper area of the substrate 80. A lens portion 61 includes a Fresnel lens disposed at a position to face the diffuser plate 30 that is disposed on the phosphor plate 20 on the LED element 10. The peripheral portion 60*a* of the cover 60 is placed on the upper surface of the circuit substrate 80 with a space between the lens portion 61 and the upper surface 30*a* of the diffuser plate 30 of the light-emitting device 100 in the first embodiment. Here, because the light-emitting device 100 has the same structure as that showed in the first embodiment, identical reference numbers are used to indicate same or similar parts of the light-emitting device in the first embodiment, and a duplicative description is omitted.

Light emitted from the diffuser plate 30 enters the lens of the cover 60 at a predetermined angle and is redirected upward by the Fresnel lens. A shape of each of the Fresnel lens and the cover can be set in accordance with a light-emitting area. With such a structure, it is possible to obtain a planar light-emitting surface that appears to be a point light source, simultaneously, a problem of a colored ring occurrence can be less represented, by the reflection of the white resin 40, and/or the diffusion and/or the color mixing of the diffuser plate 30.

In the light-emitting device 400 as mentioned above, because the light diffused through the diffuser plate 30 can be received by the lens portion 61 that extends to cover above the diffuser plate 30, light can be redirected efficiently. In addition, it is possible to prevent light leak caused by obliquely light emitted from the light-emitting device 100. The cover 60 may be formed by a transparent material.

The lens portion 61 may include a micro lens or a diffraction grating other than the Fresnel lens shown in the aforementioned embodiment. Moreover, in this embodiment, the Fresnel lens is provided at a lower side of the upper surface portion 60*b* of the cover 60 facing the LED element 10, but may be provided at an upper side of the upper surface portion 60*b* of the cover 60. The cover 60 is preferably made of a material such as a resin or glass that transmits light.

Other Embodiment

Figure 9A:
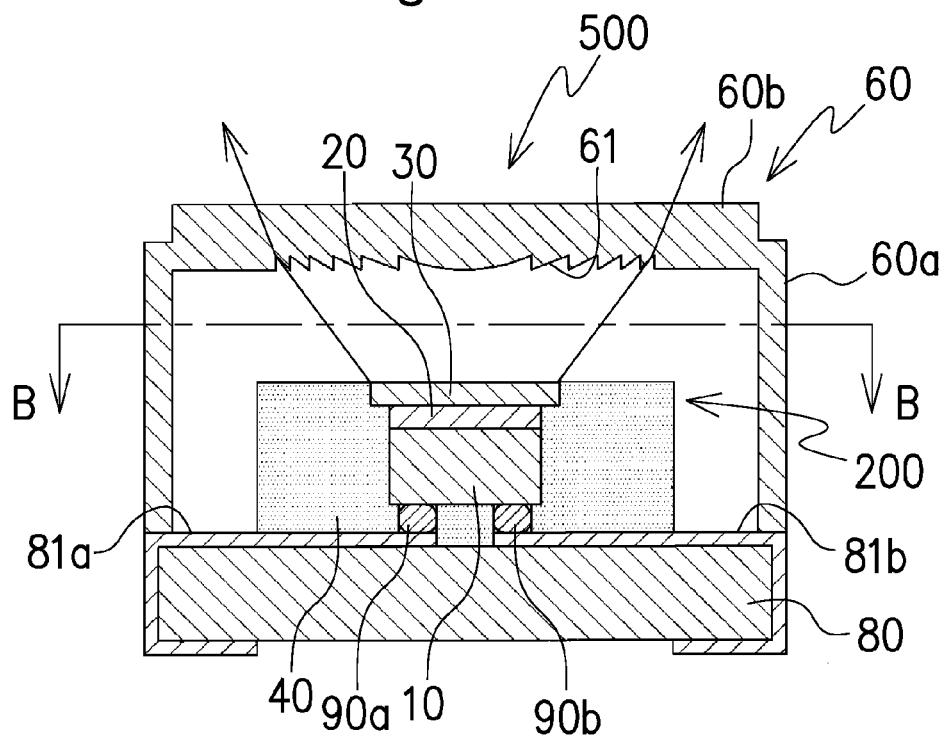
FIG. 9A is a sectional view showing a light-emitting device according to a seventh embodiment of the present invention, including a Fresnel lens.
Figure 9B:
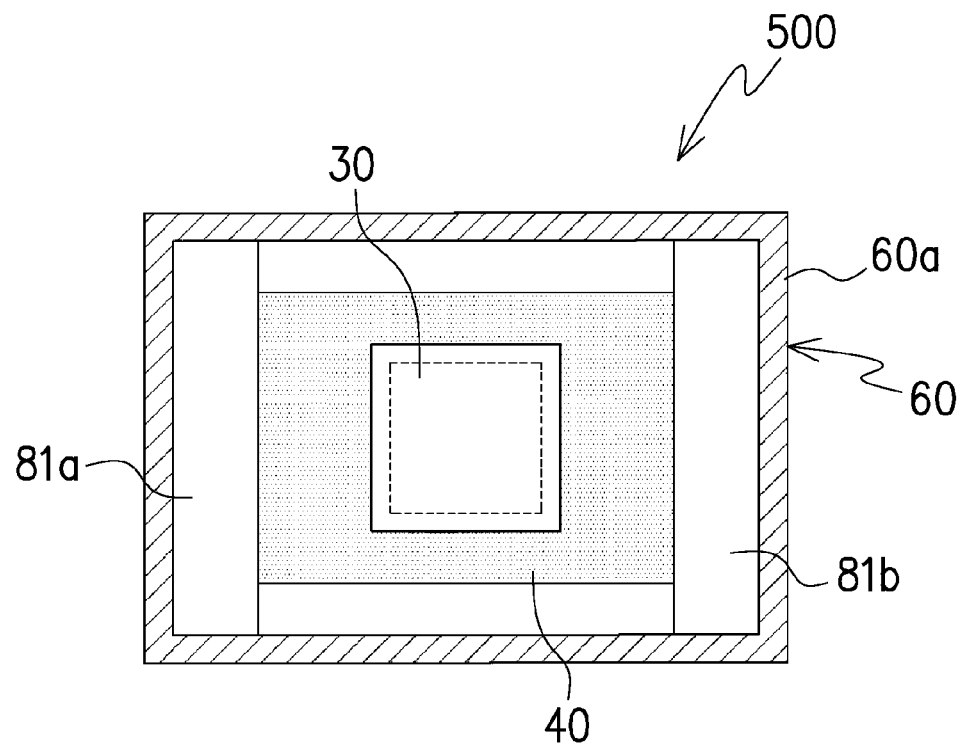
FIG. 9B is a sectional view taken along line B-B of the light-emitting device shown in FIG. 9A.

FIGS. 9A and 9B illustrate a light-emitting device according to a sixth embodiment.

Figure 10A:
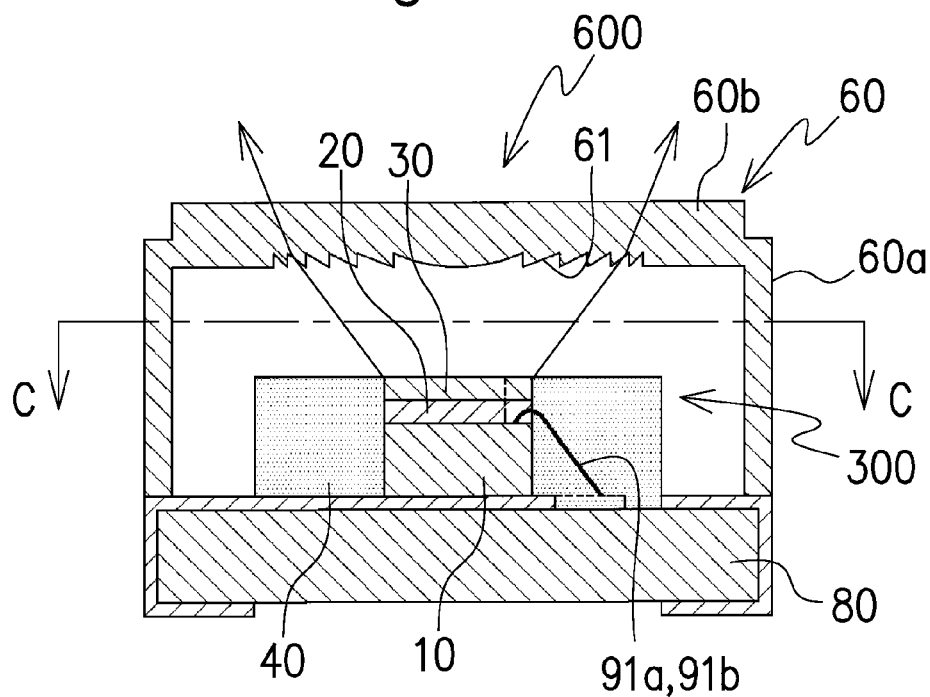
FIG. 10A is a sectional view showing a light-emitting device according to an eighth embodiment of the present invention, including a Fresnel lens.
Figure 10B:
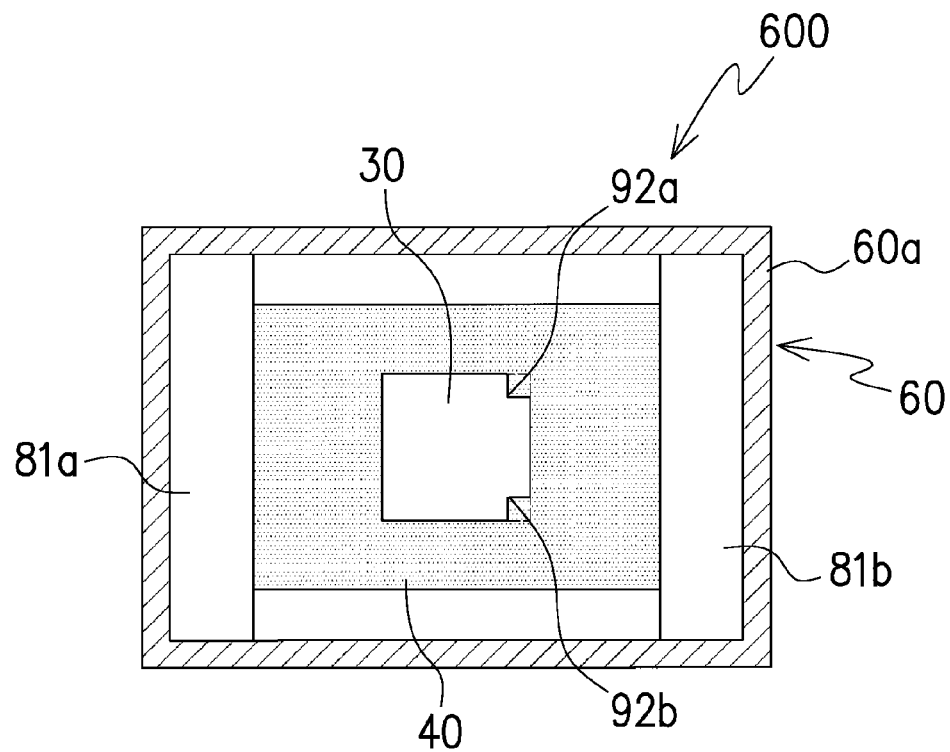
FIG. 10B is a sectional view taken along line C-C of the light-emitting device shown in FIG. 10A.

The light-emitting device 500 according to this embodiment includes the light-emitting device 200 in the second embodiment as mentioned above with the cover 60. The cover 60 has the same structure as that in the aforementioned fifth embodiment. Therefore, identical reference numbers are used for same or similar parts, and a duplicative description is omitted FIGS. 10A and 10B illustrate a light-emitting device according to a seventh embodiment.

The light-emitting device 600 according to this embodiment includes the light-emitting device 300 in the third embodiment with the cover 60. The cover 60 has the same structure as that in the aforementioned fifth embodiment. Therefore, identical reference numbers are used for same or similar parts, and a duplicative description is omitted.

Figure 11A:
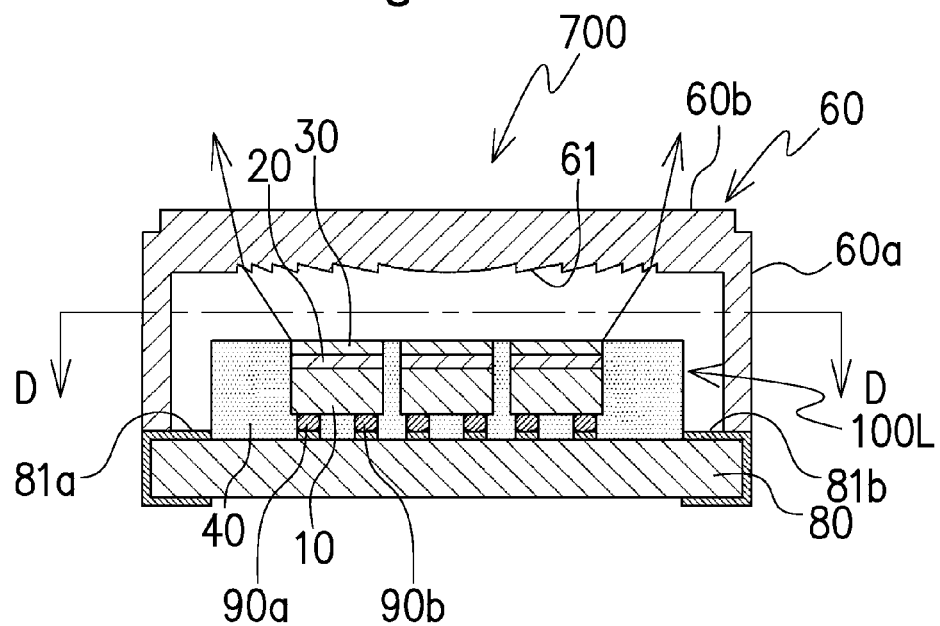
FIG. 11A is a sectional view showing a light-emitting device according to a ninth embodiment of the present invention, including a Fresnel lens.
Figure 11B:
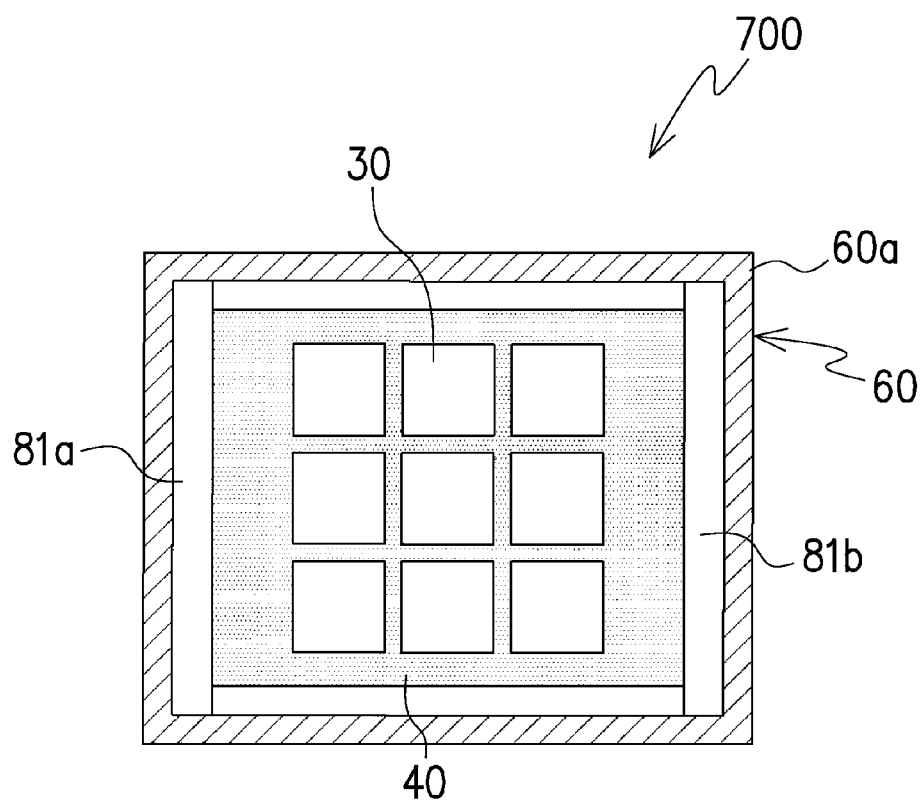
FIG. 11B is a sectional view taken along line D-D of the light-emitting device shown in FIG. 11A.

FIGS. 11A and 11B illustrate a light-emitting device according to an eighth embodiment.

The light-emitting device 700 according to this embodiment includes the light-emitting device 100L in the fourth embodiment with the cover 60. The cover 60 has the same structure as that in the aforementioned fifth embodiment. Therefore, identical reference numbers are used for same or similar parts, and a duplicative description is omitted. Meanwhile, in this embodiment, the lens portion 61 including the Fresnel lens is formed to have a larger size than the total area of upper surfaces of the first, second, third, fourth and more diffuser plates 30 mounted on the respective upper surfaces of the phosphor plates 20.

Figure 12A:
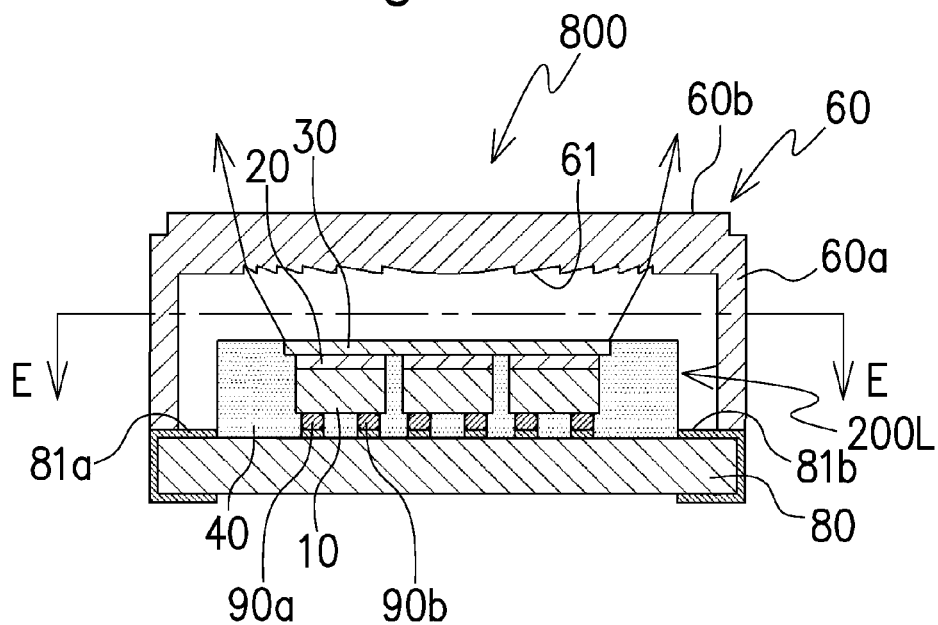
FIG. 12A is a sectional view showing a light-emitting device according to a tenth embodiment of the present invention, including a Fresnel lens.
Figure 12B:
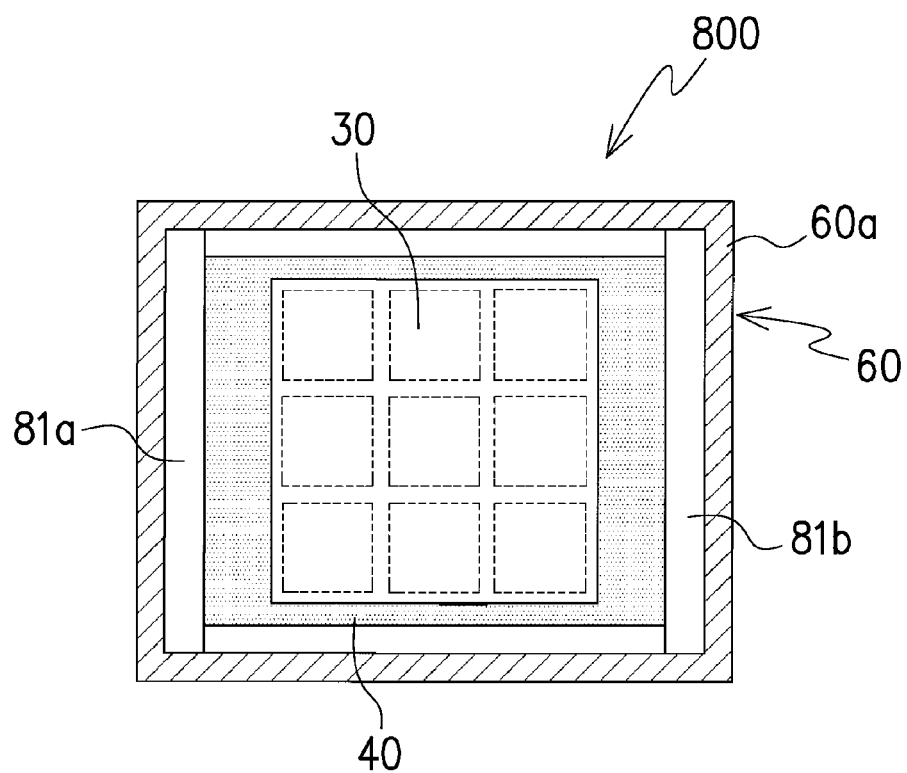
FIG. 12B is a sectional view taken along line E-E of the light-emitting device shown in FIG. 12A.
Figure 13:
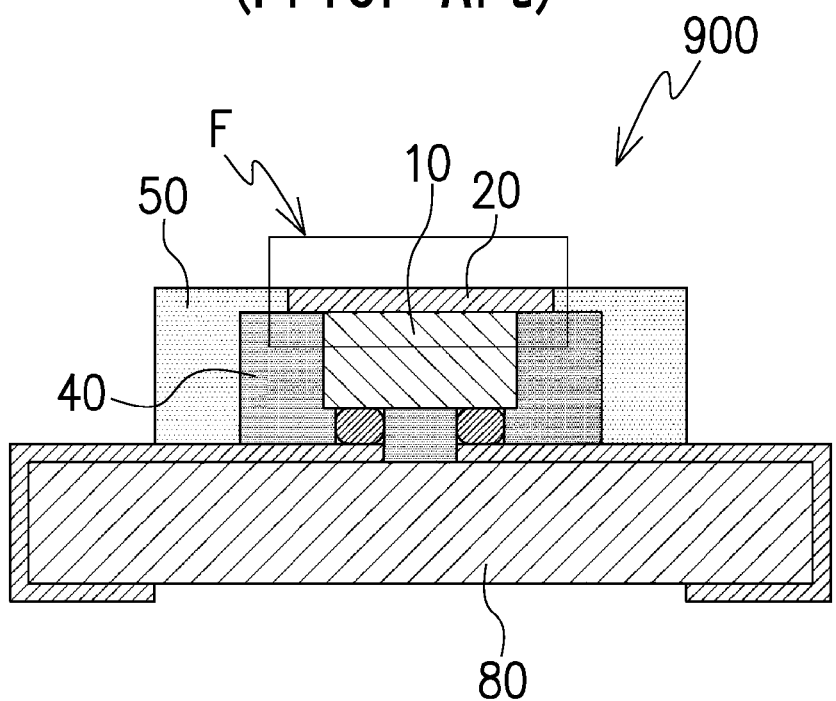
FIG. 13 is a sectional view showing schematically a conventional light-emitting device.
Figure 14:
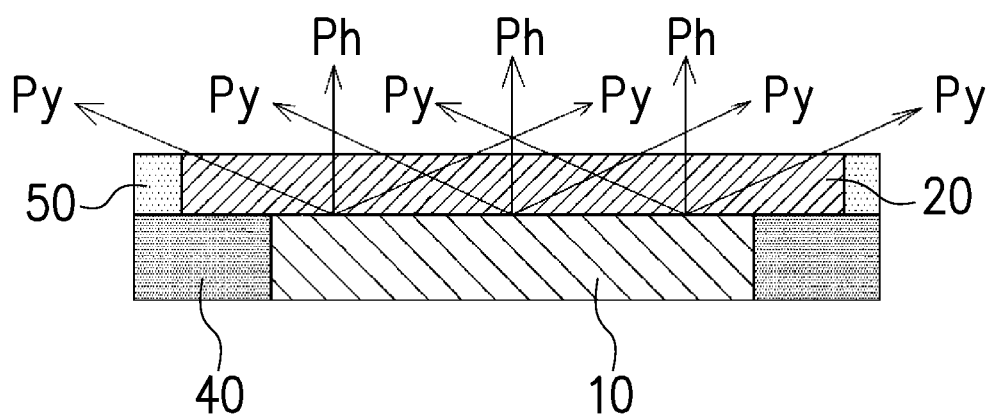
FIG. 14 is an enlarged sectional view of a portion F of FIG. 13 showing schematically an advance direction of light in the conventional light-emitting device.
Figure 15:
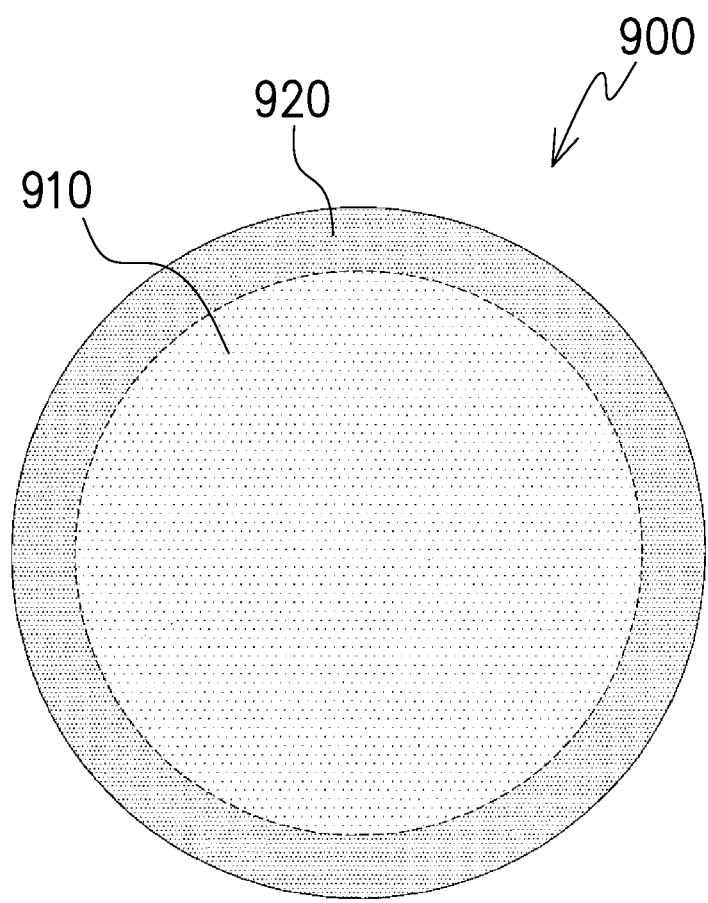
FIG. 15 is a plan view showing a colored ring on an illumination surface in the conventional light-emitting device.

FIGS. 12A and 12B illustrate a light-emitting device according to a ninth embodiment.

The light-emitting device 800 includes the light-emitting device 200L in the third embodiment with the cover 60. The cover 60 has a same structure as that in the aforementioned fifth embodiment. Therefore, identical reference numbers are used for same or similar parts, and a duplicative description is omitted.

Meanwhile, in this embodiment, the lens 61 including the Fresnel lens is formed to have a larger size than the total area of the first, second, third, fourth, and more upper surfaces of the diffuser plates 30 mounted on the upper surfaces of the phosphor plate 20.

Even in each of the light-emitting devices in the sixth to ninth embodiments, similar to the light-emitting device 400 in the fifth embodiment, it is possible to obtain a planar light-emitting area, simultaneously, a problem of a colored ring occurrence can be less represented, in the interior portion of the cover 60. In addition, because light emitted from the diffuser plate 30 is entered a certain scope of the lens portion 61 without overextending the diffusion angle, the light emitted from the lens portion 61 has also less energy loss, thereby efficient light distribution control can be accomplished.

Although the preferred embodiment of the present invention have been described, it should be understood that the present invention is not limited to these embodiments, various modifications and changes can be made to the embodiments.

What is claimed is:

1. A light-emitting device comprising:
a circuit substrate including at least a pair of electrodes;
a light-emitting diode element electrically mounted on the circuit substrate;
a phosphor plate disposed on an upper surface of the light-emitting diode element;
a diffuser plate disposed on an upper surface of the phosphor plate; and
a white resin disposed on an upper surface of the circuit substrate and contiguously covering a peripheral side surface of the light-emitting diode element, a peripheral side surface of the phosphor plate, and a peripheral side surface of the diffuser plate.

2. The light-emitting device according to claim 1:
wherein the upper surface of the light-emitting diode element, the upper surface of the phosphor plate, and the upper surface of the diffuser plate are same in size in plan view.

3. The light-emitting device according to claim 1:
wherein the upper surface of the phosphor plate and the upper surface of the diffuser plate are same in size in plan view.

4. The light-emitting device according to claim 1:
wherein the upper surface of the diffuser plate is larger than the upper surface of the phosphor plate in plan view.

5. The light-emitting device according to claim 3:
wherein the phosphor plate includes a pair of cut portions and the diffuser plate includes a pair of cut portions that overlap the pair of cut portions of the phosphor plate in plan view; and
wherein a pair of electrodes of the light-emitting diode element are positioned on the upper surface of the light-emitting diode element at the pair of cut portions of the diffuser plate and the pair of cut portions of the phosphor plate in plan view.

6. The light-emitting device according to claim 5:
wherein the pair of electrodes of the light-emitting diode element are electrically connected by a pair of wires to the at least the pair of electrodes included in the circuit substrate.

7. The light-emitting device according to claim 1:
wherein a pair of electrodes of the light-emitting diode element are positioned on a lower surface of the light-emitting diode element and electrically connected by bumps to the at least the pair of electrodes included in the circuit substrate.

8. The light-emitting device according to claim 1,
wherein the light-emitting diode element is a first light-emitting diode element, the phosphor plate disposed on the upper surface of the light-emitting diode element is the first phosphor plate, and the diffuser plate being the first diffuser plate, further comprising:
a second light-emitting diode element electrically mounted on the circuit substrate;
a second phosphor plate disposed on an upper surface of the second light-emitting diode element;
a second diffuser plate disposed on the upper surface of the second phosphor plate; and
the white resin disposed on the upper surface of the circuit substrate and contiguously covering peripheral surfaces of the first light-emitting diode element and the second light-emitting diode element, peripheral side surfaces of the first phosphor plate and the second phosphor plate, and peripheral side surfaces of the first diffuser plate and the second diffuser plate.

9. The light-emitting device according to claim 1, wherein the light-emitting diode element is a first light-emitting diode element and the phosphor plate disposed on the upper surface of the light-emitting diode element is the first phosphor plate, further comprising:
a second light-emitting diode element electrically mounted on the circuit substrate;
a second phosphor plate disposed on an upper surface of the second light-emitting diode element;
the diffuser plate disposed on the upper surfaces of the first phosphor plate and the second phosphor plate; and
the white resin disposed on the upper surface of the circuit substrate and contiguously covering peripheral side surfaces of the first light-emitting diode element and the second light-emitting diode element, peripheral side surfaces of the first phosphor plate and the second phosphor plate, and a peripheral side surface of the diffuser plate.

10. The light-emitting device according to claim 8 further comprising:
a third, a fourth and more light-emitting diode elements electrically mounted on the circuit substrate;
a third, a fourth and more phosphor plates disposed on respective upper surfaces of the third, the fourth and more light-emitting diode elements;
a third, a fourth and more diffuser plates disposed on respective upper surfaces of the third, the fourth and more phosphor plates; and
the white resin disposed on the upper surface of the circuit substrate and contiguously covering peripheral side surfaces of the first, the second, the third, the fourth and more light-emitting diode elements, peripheral side surfaces of the first, the second, the third, the fourth and more phosphor plates, and peripheral side surfaces of the first, the second, the third, the fourth, and more diffuser plates.

11. The light-emitting device according to claim 9 further comprising:
a third, a fourth and more light-emitting diode elements electrically mounted on the circuit substrate;
a third, a fourth and more phosphor plates disposed on respective upper surfaces of the third, the fourth and more light-emitting diode elements;
the diffuser plate disposed on and extended to cover the upper surfaces of the first, the second, the third, the fourth and more phosphor plates; and
the white resin disposed on the upper surface of the circuit substrate and contiguously covering peripheral side surfaces of the first, the second, the third, the fourth and more light-emitting diode elements, peripheral side surfaces of the first, the second, the third, the fourth and more phosphor plates, and the peripheral side surface of the diffuser plate.

12. The light-emitting device according to claim 1 further comprising:
a cover including a peripheral portion and an upper surface portion that is positioned at one end of the peripheral portion, and wherein the peripheral portion of the cover is disposed on the upper surface of the substrate outside the white resin, and the upper surface portion including a lens that faces the diffuser plate.

13. The light-emitting device according to claim 10 further comprising:
   a cover including a peripheral portion and an upper surface portion that is positioned at one end side of the peripheral portion, and wherein the peripheral portion of the cover is disposed on the upper surface of the substrate outside the white resin, and the upper surface portion including a lens that faces the first, the second, the third, the fourth and more diffuser plates.

14. The light-emitting device according to claim 11 further comprising:
   a cover including a peripheral portion and an upper surface portion that is positioned at one end side of the peripheral portion, and wherein the peripheral portion of the cover is disposed on the upper surface of the substrate outside the white resin, and the upper surface portion including a lens that faces the diffuser plate.

15. The light-emitting device according to claim 12:
   wherein the lens included in the upper surface portion of the cover is a Fresnel lens.

16. The light-emitting device according to claim 13:
   wherein the lens included in the upper surface portion of the cover is a Fresnel lens.

17. The light-emitting device according to claim 14:
   wherein the lens included in the upper surface portion of the cover is a Fresnel lens.

18. The light-emitting device according to claim 17:
   wherein the Fresnel lens is larger than the diffuser plate extended to cover the upper surfaces of the first, the second, the third, the fourth and more phosphor plates.

\* \* \* \* \*